United States Patent
Natori et al.

(10) Patent No.: US 12,010,845 B2
(45) Date of Patent: Jun. 11, 2024

(54) METHOD FOR MANUFACTURING SEMICONDUCTOR DEVICE

(71) Applicant: Kioxia Corporation, Tokyo (JP)

(72) Inventors: Katsuaki Natori, Yokkaichi Mie (JP); Hiroshi Toyoda, Yokkaichi Mie (JP); Koji Yamakawa, Yokkaichi Mie (JP); Takayuki Beppu, Yokkaichi Mie (JP); Masayuki Kitamura, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 57 days.

(21) Appl. No.: 17/459,856

(22) Filed: Aug. 27, 2021

(65) Prior Publication Data
US 2022/0085066 A1 Mar. 17, 2022

(30) Foreign Application Priority Data

Sep. 14, 2020 (JP) .................. 2020-153727

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ......... H01L 27/11582; H01L 27/11556; H01L 21/02205–02222; H01L 21/02271–0228; H01L 21/28556–28562; C23C 16/00–16/56
See application file for complete search history.

(56) References Cited

U.S. PATENT DOCUMENTS

| 10,392,698 B2 | 8/2019 | Kaneko et al. |
| 2017/0314130 A1 | 11/2017 | Hirose et al. |
| 2018/0254187 A1* | 9/2018 | Purayath ............. H01L 29/0649 |
| 2019/0067003 A1 | 2/2019 | Zope et al. |

(Continued)

FOREIGN PATENT DOCUMENTS

| JP | 6516436 B2 | 5/2019 |
| JP | 2019-145589 A | 8/2019 |

(Continued)

OTHER PUBLICATIONS

A. L. Goodman, E. T. Bernard, and V. H. Grassian "Spectroscopic Study of Nitric Acid and Water Adsorption on Oxide Particles:? Enhanced Nitric Acid Uptake Kinetics in the Presence of Adsorbed Water", The Journal of Physical Chemistry A 2001 105 (26), 6443-6457, Jun. 13, 2001 URL: https://doi.org/10.1021/jp0037221.

(Continued)

*Primary Examiner* — Suberr L Chi
*Assistant Examiner* — Carnell Hunter, III
(74) *Attorney, Agent, or Firm* — Foley & Lardner LLP

(57) ABSTRACT

According to one embodiment, a method for manufacturing a semiconductor device includes: (a) supplying an adsorbing material over an insulating film, wherein the adsorbing material is selected from the group consisting of $H_2O$, HF, NO, $NO_2$, $NF_3$, and combinations thereof; (b) supplying a Mo material over the insulating film; (c) supplying a reducing agent over the insulating film; and (d) repeating the steps (a) to (c).

20 Claims, 8 Drawing Sheets

(56) References Cited

U.S. PATENT DOCUMENTS

| | | | |
|---|---|---|---|
| 2019/0067094 A1 | | 2/2019 | Zope et al. |
| 2019/0259621 A1 | * | 8/2019 | Natori .................... C23C 16/14 |
| 2020/0051993 A1 | * | 2/2020 | Rabkin ............ H01L 21/76832 |
| 2020/0066750 A1 | | 2/2020 | Takahashi et al. |
| 2020/0091080 A1 | | 3/2020 | Wakatsuki et al. |
| 2021/0062331 A1 | * | 3/2021 | Chen ................. C23C 16/45527 |

FOREIGN PATENT DOCUMENTS

| | | |
|---|---|---|
| JP | 2020-029617 A | 2/2020 |
| JP | 2020-031151 A | 2/2020 |
| JP | 2020-047702 A | 3/2020 |

OTHER PUBLICATIONS

C. Paze, G. Gubitosa, S. Orso Giacone, G. Spoto, F.X. Llabr?s i Xamena & A. Zecchina, "An XRD, FTIR and TPD investigation of NO2 surface adsorption sites of d, ? Al2O3 and barium supported d, ? Al2O3", Magneti Marelli Sistemi di Scarico S.p.A., Viale Carlo Emanuele II 150, 10078, Venaria Reale (TO), Italy, Dipartimento di Chimica IFM, Via Giuria 7, 10139, Torino, Italy, 6th Congress on Catalysis and Automotive Pollution Control. Brussels, Belgium, Oct. 22-24, 2003, Topics in Catalysis, vol. 30-31, Jul. 2004, p. 169-175.

E. E. Chain, K. Seshan, and B. O. Seraphin "Optical and structural properties of black molybdenum photothermal converter layers deposited by the pyrolysis of Mo(CO)6"Optical Science Center, University of Arizona, Journal of Applied Physics 52, 1356 (1981), Aug. 14, 1998 URL: https://doi.org/10.1063/1.329764.

K. Hansson, Jan Erik Svensson, Mats Halvarsson, Jun Eu Tang, M. Sundberg, Robert Pompe "The Influence of Water Vapor on the Oxidation of MoSi2 at 450?C.", Materials Science Forum (vols. 369-372) Issue 1, 419-426, Oct. 2001 URL: https://doi.org/10.4028/www.scientific.net/MSF.369-372.419.

Lu,J., Shi,L.,Yang, H., Chen,S., Ren, J., Li,H., Peng,S., "Property of AlF3 catalysts prepared by fluorination of Al2O3 with HF", Xian Mod. Chem. Research Institute, Xi'an 710065, Shanxi Institute of Coal Chemistry, Chinese Academy of Sciences, Chinese Jornal of Catalysis, vol. 17, Issue 5, 1996, p. 459-461.

V. M. Bermudez "Observation of adsorption and reaction of NH3 on crystalline Al2O3 under steady-state conditions using external-reflection infrared spectroscopy" Naval Research Laboratory, Washington DC, Journal of Vacuum Science & Technology A 16, 2572 (1998), Jul. 9, 1998 URL: https://doi.org/10.1116/1.581384.

* cited by examiner

METHOD FOR MANUFACTURING SEMICONDUCTOR DEVICE

CROSS-REFERENCE TO RELATED APPLICATION(S)

This application is based upon and claims the benefit of priority from Japanese Patent Application No. 2020-153727, filed Sep. 14, 2020, the entire contents of which are incorporated herein by reference.

FIELD

Embodiments described herein relate generally to a method for manufacturing a semiconductor device.

BACKGROUND

To increase the integration density of a semiconductor memory device, a three-dimensional stacked non-volatile memory device having three-dimensionally stacked memory cells has been proposed. In a three-dimensional stacked non-volatile memory device, a stacked structure including insulating films and conductive films is formed around a memory hole. The use of a high-melting metal, such as molybdenum (Mo), for the conductive films is being studied. CVD (Chemical Vapor Deposition), ALD (Atomic Layer Deposition), or the like is used to form such a conductive film. There is a demand for enhancing the formability of a Mo film formed by CVD or ALD on an insulating film, such as an aluminum oxide film.

DETAILED DESCRIPTION

Figure 1:
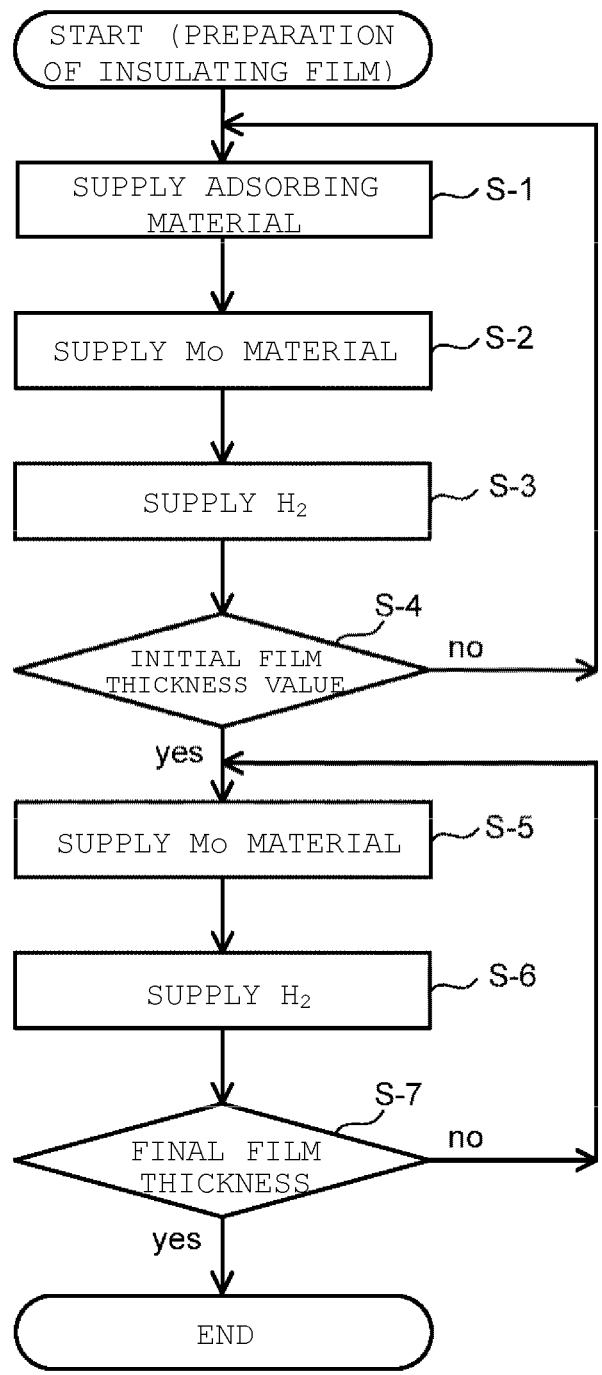
FIG. 1 is a flow chart showing a semiconductor device manufacturing method according to a first embodiment.

Embodiments provide a semiconductor device manufacturing method which makes it possible enhance the formability of a Mo film by CVD, ALD, or the like.

In general, according to one embodiment, a semiconductor device manufacturing method comprises: (a) supplying an adsorbing material over an insulating film, wherein the adsorbing material is selected from the group consisting of $H_2O$, HF, NO, $NO_2$, $NF_3$, and combinations thereof; (b) supplying a Mo material over the insulating film; (c) supplying a reducing agent over the insulating film; and (d) repeating the steps (a) to (c).

Embodiments of the present disclosure will now be described with reference to the drawings. In the drawings and the description below, same symbols are used for the same or similar components or elements, and a description thereof may be partly omitted. The drawings are schematic; thus, the relationship between a thickness and a planar size, the thickness ratio between components or elements, etc. are not necessarily to scale.

First Embodiment

Figure 2A:
FIGS. 2(A) through 2(E) are diagrams illustrating the semiconductor device manufacturing method according to the first embodiment.

A semiconductor device manufacturing method according to a first embodiment includes a process of forming a Mo film on an insulating film by CVD, ALD, or the like. The Mo film formation process according to the first embodiment will be described with reference to FIGS. 1 and 2. As shown by the "Start" in FIG. 1 and as shown in FIG. 2(A), an insulating film 1 is first prepared. The insulating film 1 is provided, for example, on a semiconductor substrate (not shown), and may be formed on the semiconductor substrate either directly or via another film. A metal oxide, a metal nitride, a metal oxynitride, or the like, may be used a material for the insulating film 1. For example, aluminum oxide may be used as a material for the insulating film 1.

Figure 2B:
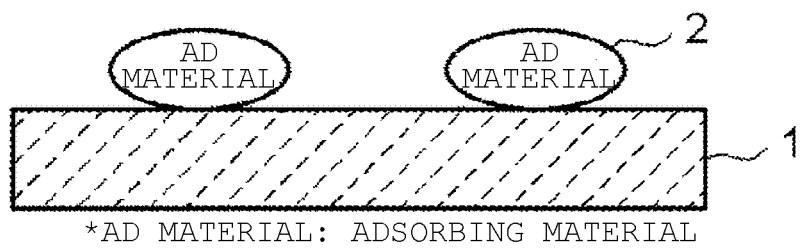

Next, as shown in FIG. 2(B), an adsorbing material 2 is supplied to the surface of the insulating film 1 (step S-1). The adsorbing material 2 promotes adsorption of a Mo material, which is to be supplied in a later step S-2, onto the insulating film 1. At least one material selected from the group consisting of $H_2O$, HF, NO, $NO_2$, $NF_3$, and combinations thereof is used as the adsorbing material 2. If the Mo material is solely supplied onto the insulating film 1, Mo material forms a small number of nuclei and the Mo will grow in the form of islands on the insulating film 1. Further, when the Mo film is formed at a low temperature, the Mo material will be decomposed at a low rate, leading to a low Mo-film formation rate. Thus, the productivity of a Mo film is low when it is formed by solely supplying the Mo material onto the insulating film 1. In addition, when a conductive film formation space has a high aspect ratio, the degree of filling of the Mo film will be low.

Figure 2C:
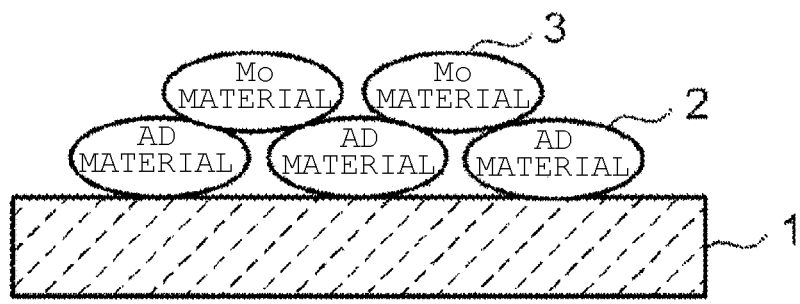

The step of adsorbing the adsorbing material 2, which is at least one material selected from the group consisting of $H_2O$, HF, NO, $NO_2$ and $NF_3$, onto the insulating film 1 is performed as a preceding step before the Mo film formation step. The amount of the adsorbing material 2 supplied is adjusted by the partial pressure of the adsorbing material 2 in a film-forming chamber. For example, when $H_2O$ is used as the adsorbing material 2, the partial pressure is adjusted to about 200 to 500 Pa in consideration of a film-forming pressure. Next, as shown in FIG. 2(C), a Mo material 3 is supplied to the surface of the insulating film 1 onto which the adsorbing material 2 has been adsorbed (step S-2). The adsorption of the Mo material 3 onto the surface of the insulating film 1 is promoted by the adsorbing material 2 on the surface of the insulating film 1. $MoO_2Cl_2$, $MoCl_5$ or $MoCO_2$, for example, is used as the Mo material 3. A halide, a carbonyl compound, an amino compound, etc. of Mo can also be used as the Mo material 3.

Figure 2D:
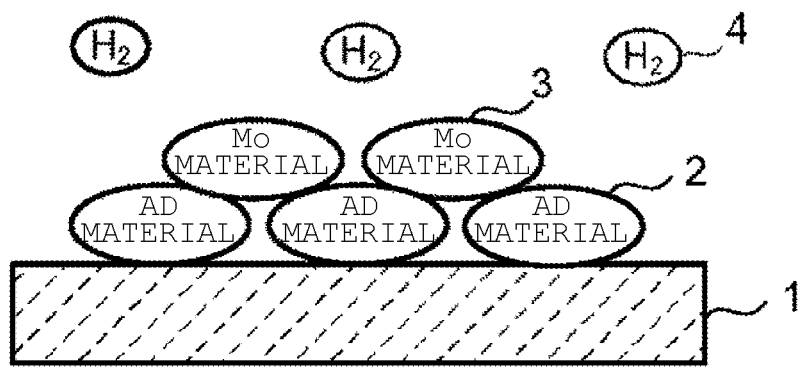
Figure 2E:

Next, as shown in FIG. 2(D), a reducing agent such as $H_2$ gas 4 is supplied to the insulating film 1 (step S-3) to reduce the adsorbing material 2 and the Mo material 3, which have been adsorbed onto the surface of the insulating film 1, thereby forming a Mo film 5 on the insulating film 1 as shown in FIG. 2(E). After performing the steps S-1, S-2 and S-3, a determination is made as to whether the thickness of the Mo film 5, formed on the surface of the insulating film 1, has reached a predetermined value (step S-4). The predetermined value is hereinafter referred to as the initial value. The initial value is, for example, such a value as to cover the entire surface of the insulating film 1 with the Mo film 5. If the thickness of the Mo film 5 has not yet reached the initial value, the steps S-1, S-2 and S-3 are performed repeatedly (first step). If the thickness of the Mo film 5 has reached the initial value, a step of supplying the Mo material 3 (step S-5) and a step of supplying $H_2$ gas 4 (step S-5) are performed without performing a step of supplying the adsorbing material 2 such as $H_2O$ (step S-1). The steps S-5 and S-6 are performed in the same manner as in the steps S-2 and S-3, respectively. A determination is made as to whether the thickness of the Mo film 5, formed on the surface of the insulating film 1, has reached a desired final value (final film thickness) (step S-7). If the thickness of the Mo film 5 has not yet reached the final film thickness, the steps S-5 and S-6 are performed repeatedly (second step). In this manner, the Mo film 5 having a desired thickness can be obtained.

The steps for forming the Mo film. 5 according to the first embodiment may be applied, for example, in a method for manufacturing a semiconductor device such as a memory device. A method for increasing the integration degree of a memory device, such as a three-dimensional stacked non-volatile memory device, is to increase the number of stacked word lines (WLs). In order to reduce the overall film thickness which increases with the increase in the number of stacked WLs, it is necessary to reduce the thickness of each WL. The reduction in the thickness of WL leads to an increase in the resistance; therefore, it is preferred to use a low-resistance material. While tungsten (W), for example, is used as a low-resistance material, Mo is effective as a material having a lower resistance than W. Mo provides a thin low-resistance film.

An ALD method having a good coverage, for example, is used for the formation of WL. This method has the problem of slow Mo-film formation rate especially in the initial stage of film formation due to insufficient adsorption of Mo onto a base insulating film, such as $Al_2O_3$, during the formation of the Mo film. On the other hand, $H_2O$ is known to easily adsorb onto the surface of $Al_2O_3$. Further, since Mo easily combines with oxygen, $H_2O$ easily reacts with a Mo material to form $MoO_x$. By utilizing such properties, $H_2O$ is first supplied and adsorbed onto the surface of an insulating film, such as $Al_2O_3$, and then a Mo material is supplied to the $H_2O$-adsorbed surface to form $MoO_x$ on the surface of $Al_2O_3$. Thereafter, $H_2$ is supplied to reduce $MoO_x$, whereby Mo can be formed. $H_2$ may reduce Mo and $H_2O$. A repetition of the cycle of the supply of $H_2O$, the supply of the Mo material and the supply of $H_2$ to the $Al_2O_3$ film enables the formation of a Mo film. The reaction between the Mo material and $H_2$ is active on the Mo film by the catalytic action of Mo. Therefore, the $H_2O$ supply step can be omitted after the cycle of the supply of $H_2O$, the supply of the Mo material and the supply of $H_2$ is repeated until the thickness of the Mo film reaches a certain level. Thus, the cycle of the supply of $H_2O$, the supply of the Mo material and the supply of $H_2$ is repeated in the initial stage of film formation and, after the thickness of the Mo film has reached a predetermined thickness, the cycle of the supply of the Mo material and the supply of $H_2$ is repeated. In this manner, the Mo film having a desired thickness can be obtained. Ar may be supplied in the intervals between the supplies of the respective gases.

Figure 3:
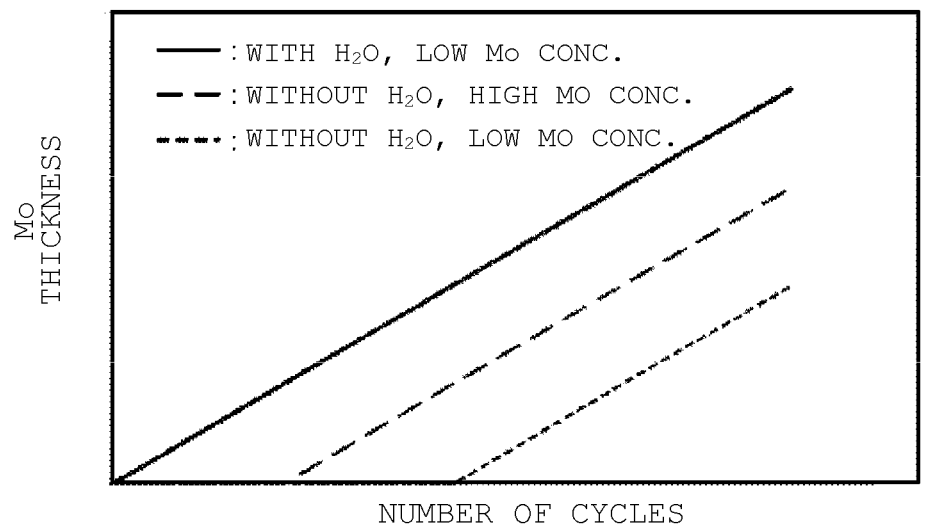
FIG. 3 is a diagram showing the Mo-concentration dependency of the rate of formation of a Mo film on the surface of aluminum oxide.

The rate of adsorption of the Mo material onto the surface of $Al_2O_3$ depends on the concentration of the Mo material. Thus, when a Mo film is filled into, for example, a WL formation region (e.g. a cavity) having a high aspect ratio, the Mo formation rate is fast in an area (near the entrance) which the Mo material easily reaches, and is slow in an area which the Mo material hardly reaches. This may result in poor coverage. On the other hand, the rate of adsorption of $H_2O$ to $Al_2O_3$ is fast; therefore, $H_2O$ can be adsorbed uniformly onto the surface of $Al_2O_3$. FIG. 3 shows the Mo-concentration dependency of the rate of formation of a Mo film on the surface of $Al_2O_3$.

In an ALD method that only uses a Mo material and $H_{er}$, there exists a period of time (incubation time) when no formation of a Mo film occurs in the initial stage of film formation. The higher the concentration of the Mo material, the shorter the incubation time. This indicates that the adsorption of the Mo material onto $Al_2O_3$ depends on the concentration of the Mo material, and therefore when the concentration of the Mo material is low, the adsorption density is low and the incubation time is long. On the other hand, the incubation time is short in an ALD method that uses $H_2O$. More preferably, the incubation time is zero. This indicates that because of the fast rate of adsorption of $H_2O$ onto the surface of $Al_2O_3$, saturation adsorption of $H_2O$ onto the surface of $Al_2O_3$ occurs on the entire surface in the initial stage of film formation, and that the $H_2O$ reacts with the Mo material, whereby the formation of a Mo film starts from the initial stage.

In a complicated structure having a high aspect ratio, the Mo material gas diffusion time is non-uniform. Therefore, the Mo concentration on the surface of $Al_2O_3$ is non-uniform, and thus the thickness of a Mo film is non-uniform under conditions in which the incubation time depends on the concentration of the Mo material. In the case of WL of a three-dimensional stacked non-volatile memory device or the like, the concentration of a Mo material tends to be high in an area near the entrance for a WL, and tends to decrease with distance from the entrance. Therefore, when a material system with a long incubation time is employed, the rate of formation of a Mo film is faster in an area near the WL entrance than in an inner area. Consequently, the area near the WL entrance can be closed up before the inner area becomes filled with a Mo film, causing a deterioration of the Mo embedding properties. On the other hand, when the sequence of this embodiment that uses $H_2O$ is employed, the incubation time is substantially zero, and a uniform reaction occurs on the entire surface of $Al_2O_3$. This makes it possible to prevent the closing in the vicinity of the WL entrance, thereby ensuring good embedding properties.

Besides $H_2O$, other materials such as HF, NO, $NO_2$ and $NF_3$ are also known to be adsorbable onto the surface of $Al_2O_3$. Such materials may be used in place of $H_2O$ in the initial stage of the formation of a Mo film. The adsorption of a Mo material can be promoted and the incubation time can be reduced also by using HF, NO, $NO_2$, $NF_3$, or the like as an adsorbing material instead of $H_2O$. The same effect can be achieved also when a metal oxide, other than $Al_2O_3$, is used as an insulating film. Further, the same effect can be expected for the use of a metal nitride or a metal oxynitride as an insulating film. The manufacturing method of this embodiment is more effective when an oxygen-containing insulating material, such as a metal oxide or a metal oxynitride, is used as a material for an insulating film.

Second Embodiment

Figure 4:
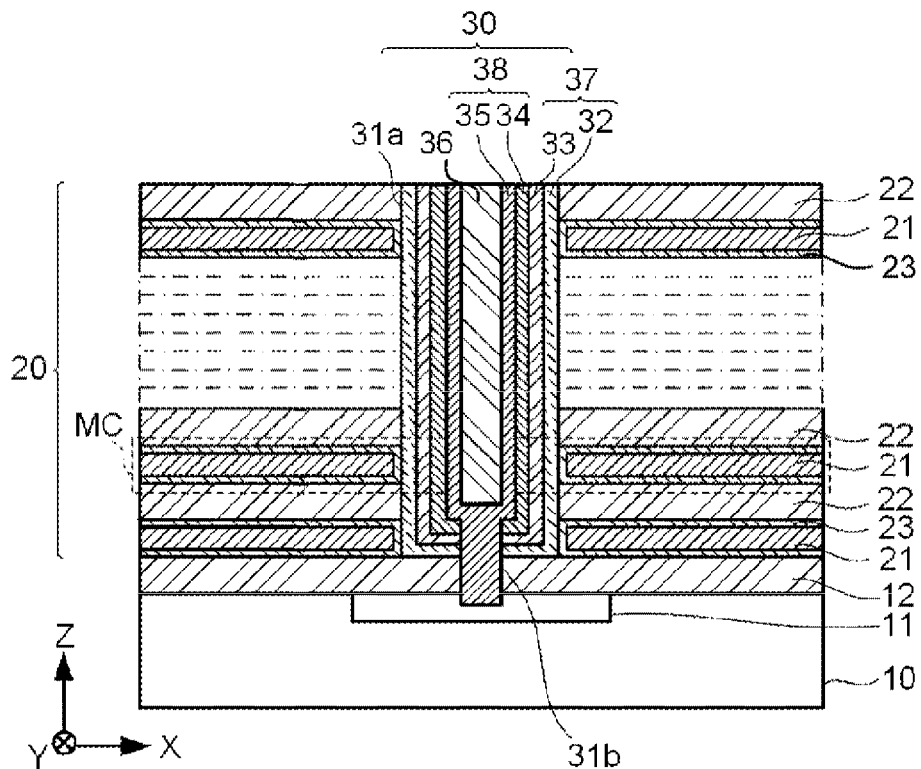
FIG. 4 is a cross-sectional view illustrating a semiconductor device manufacturing step according to a second embodiment.

A semiconductor device manufacturing method according to a second embodiment may be applied, for example, to the manufacturing of a semiconductor memory device having a memory cell array. FIG. 4 is a cross-sectional view showing a memory cell in a semiconductor memory device manufactured using the manufacturing method of the second embodiment. The semiconductor memory device shown in FIG. 4 includes a semiconductor substrate 10, a stacked structure 20 provided on the semiconductor substrate 10, and a columnar portion 30 extending in the stacking direction of the stacked structure 20. In FIG. 4, X direction and Y direction refer to two directions intersecting each other and parallel to the main surface of the semiconductor substrate 10, and Z direction refers to a direction (stacking direction) intersecting both the X direction and the Y direction.

The semiconductor substrate 10 has a diffusion layer 11 connected to a selection transistor. The stacked structure 20 is provided via an interlayer insulating film 12 on the semiconductor substrate 10 having the diffusion layer 11. The stacked structure 20 includes a plurality of conductive films 21 and a plurality of insulating films 22. The conductive films 21 and the insulating films 22 are stacked alternately in the Z direction. A molybdenum (Mo) film having a thickness of about 30 nm is used as each conductive film 21, as will be described in detail below. A silicon oxide film having a thickness of about 30 nm is used as each insulating film 22. An aluminum oxide film as a block insulating film 23 is formed around each conductive film 21.

The conductive films 21 are formed by alternately forming silicon oxide films as the insulating films 22 and silicon nitride films, selectively etching away the silicon nitride films, forming aluminum oxide films 23 on the wall surfaces surrounding spaces formed by the removal of the silicon nitride films, and then filling Mo into the remaining spaces by CVD or ALD.

The columnar portion 30 penetrates the stacked structure 20 in the Z direction, and has a periphery 31a. One end of the columnar portion 30 reaches the diffusion layer 11 provided in the semiconductor substrate 10. The columnar portion 30 has a MONOS (Metal-Oxide-Nitride-Oxide-Silicon) structure. Thus, a silicon nitride film as a charge storage film 32, a silicon oxide film as a tunnel insulating film 33, and a silicon film as a channel film 34 are formed along the periphery 31a of the columnar portion 30 and disposed in this order from the side of the stacked structure 20.

A silicon film 35 is formed inside the channel film 34, and a silicon oxide film 36 is formed inside the silicon film 35. The silicon film 35 has a projecting portion 31b which extends in the Z direction to make an electrical connection between the channel film 34 and the diffusion layer 11. The charge storage film 32 and the tunnel insulating film 33 constitute a memory film 37. The channel film 34 and the silicon film 35 constitute a semiconductor film 38.

The conductive films 21, the block insulating films 23, the memory film 37, and the semiconductor film 38 constitute memory cells MC arranged in the Z direction. The memory cells MC have a vertical transistor structure in which the semiconductor film 38 is circumferentially surrounded by the conductive films 21 via the memory film 37. The semiconductor film 38 functions as a channel and the conductive films 21 each function as a control gate (control electrode) of the memory cells MC having a vertical transistor structure. The charge storage film 32 functions as a data storage layer for storing charges injected from the semiconductor film 38.

In a semiconductor device (three-dimensional stacked non-volatile memory device) having the memory cells MC of a vertical transistor structure, increasing the number of the conductive films 21 and the insulating films 22 stacked is effective to increase the degree of integration. The increase in the number of the stacked layers increases the thickness of the stacked structure 20. A reduction in the thickness of each conductive film 21 is required to provide a smaller-sized thinner device. However, the reduction in the thickness of a Mo film as a conductive film 21 increases the aspect ratio of a Mo-film formation space, which may lead to a failure to sufficiently embed a Mo film into the formation space. The above-described method according to the first embodiment can therefore be advantageously used for the formation of a Mo film as a conductive film 21.

Figure 5:
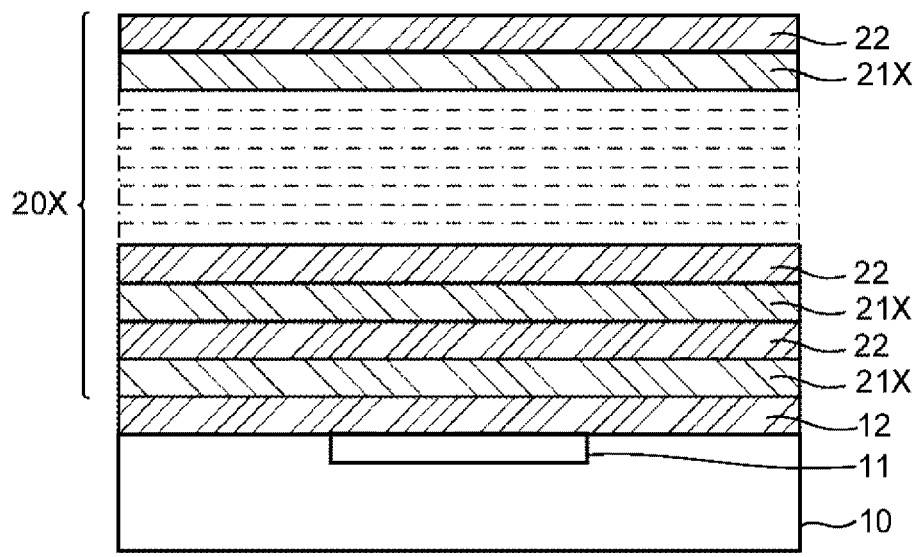
FIG. 5 is a cross-sectional view illustrating a semiconductor device manufacturing step according to the second embodiment.
Figure 6:
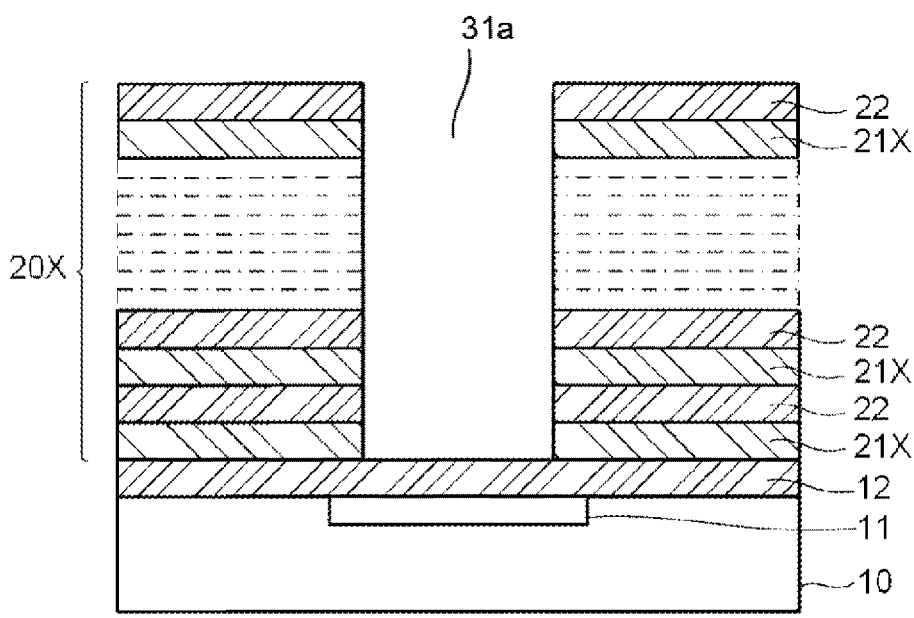
FIG. 6 is a cross-sectional view illustrating a semiconductor device manufacturing step according to the second embodiment.

A semiconductor device manufacturing method according to a second embodiment will now be described with reference to FIGS. 5 through 14. First, as shown in FIG. 5, silicon nitride films 21X each having a thickness of about 30 nm and silicon oxide films 22 as insulating films 22, each having a thickness of about 30 nm, are formed alternately by CVD on a semiconductor substrate 10 having a diffusion layer 11, via an interlayer insulating film 12, to form a stacked structure 20X. The stacked structure 20X is composed of, for example, 100 layers of the silicon nitride films 21X and 100 layers of the insulating films 22. Subsequently, as shown in FIG. 6, a memory hole 31a is formed in the stacking direction (Z direction) of the stacked structure 20X using lithography. The diameter of the memory hole 31a is, for example, 80 nm.

Figure 7:
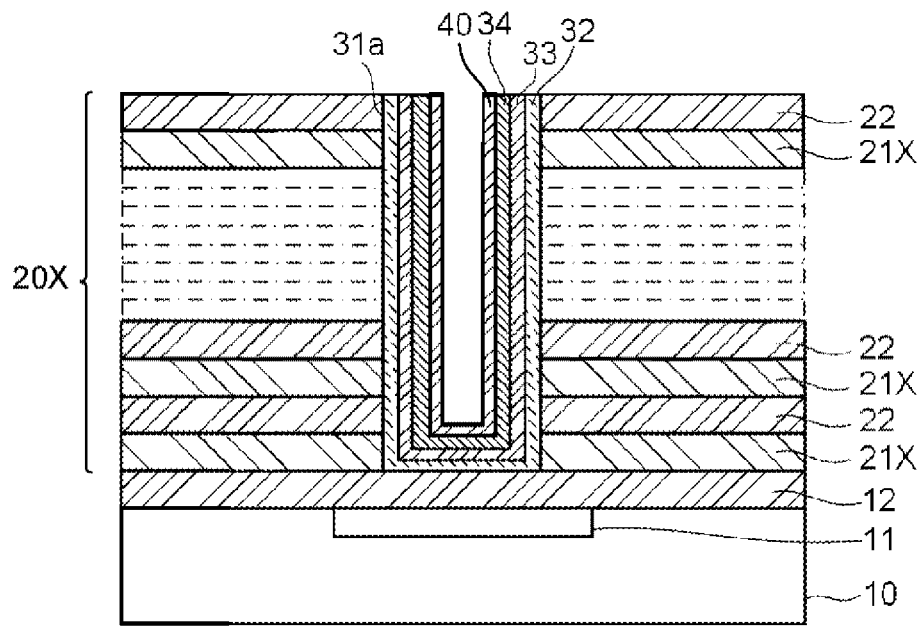
FIG. 7 is a cross-sectional view illustrating a semiconductor device manufacturing step according to the second embodiment.

Next, as shown in FIG. 7, a silicon nitride film having a thickness of about 5 nm as a charge storage film 32, a silicon oxide film having a thickness of about 8 nm as a tunnel insulating film 33, a polysilicon film having a thickness of about 5 nm as a channel film 34, and a silicon oxide film having a thickness of about 5 nm as a side wall film 40 are formed sequentially in the memory hole 31a. The silicon nitride film is formed by an ALD method using tris(dimethylamino) silane (3DMAS) and $NH_3$, and the silicon oxide film is formed by an ALD method using 3DMAS and $O_3$.

Figure 8:
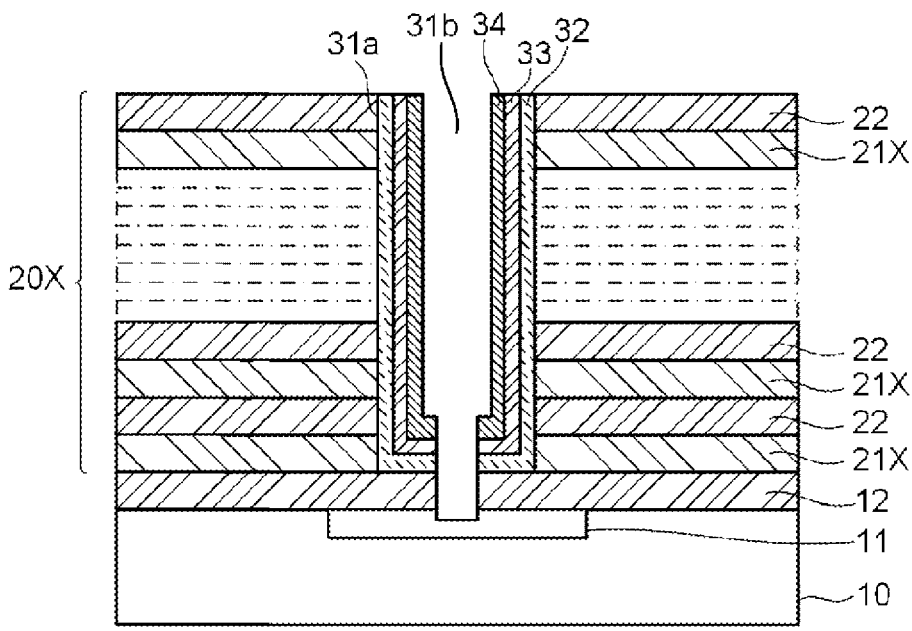
FIG. 8 is a cross-sectional view illustrating a semiconductor device manufacturing step according to the second embodiment.
Figure 9:
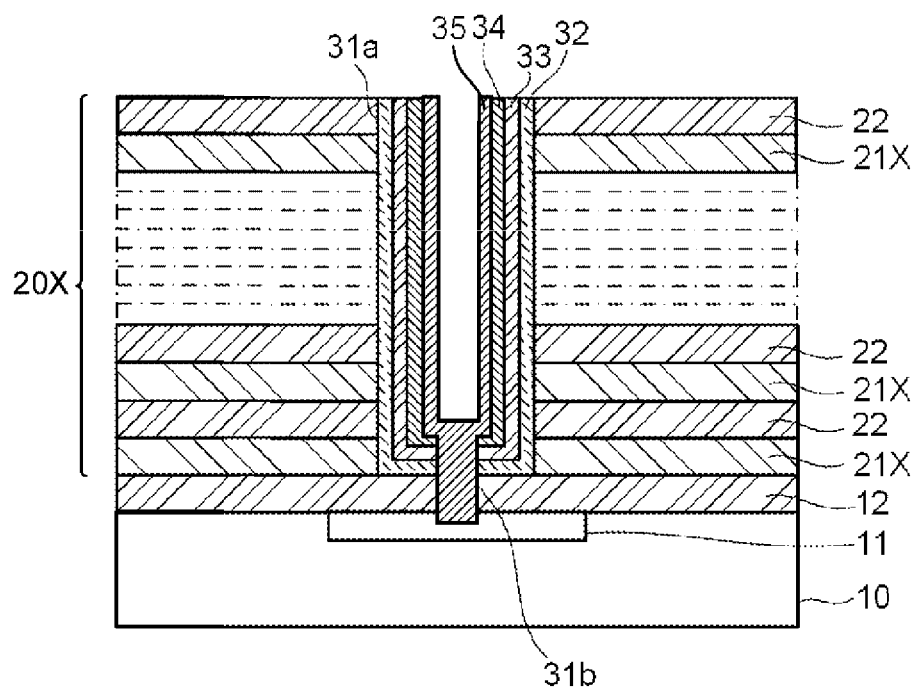
FIG. 9 is a cross-sectional view illustrating a semiconductor device manufacturing step according to the second embodiment.
Figure 10:
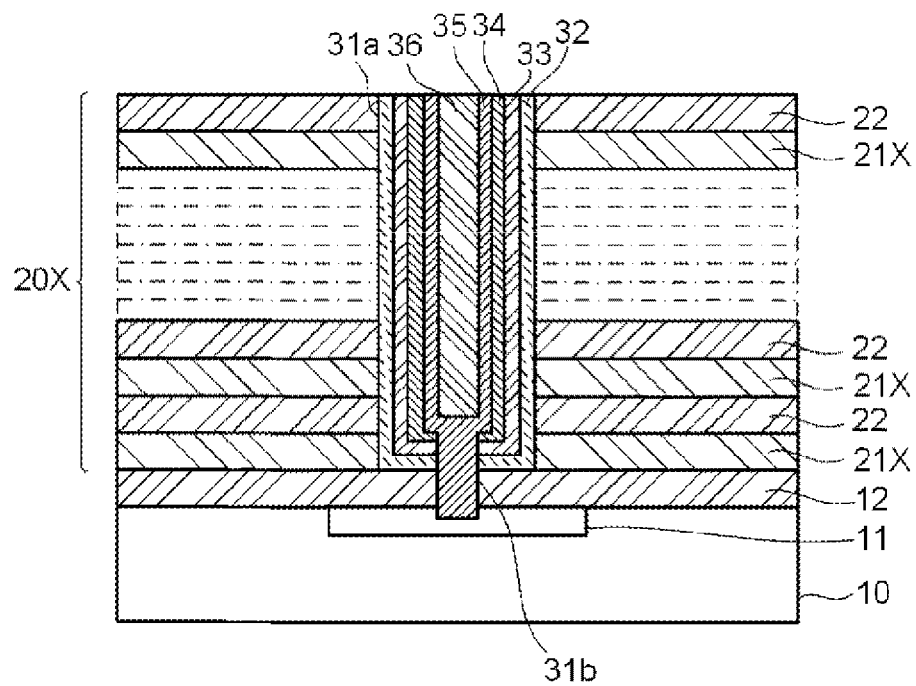
FIG. 10 is a cross-sectional view illustrating a semiconductor device manufacturing step according to the second embodiment.

As shown in FIG. 8, using the side wall film 40 as a mask, bottom portions of the films 32, 33, 34 and a portion of the interlayer insulating film 12 are etched away by RIE (Reactive Ion Etching) to expose the diffusion layer 11. Subsequently, the side wall film 40 is etched away by selective RIE to expose the channel film (polysilicon film) 34. As shown in FIG. 9, a polysilicon film 35 is formed along the inner wall of the channel film 34 to electrically connect the channel film 34 to the diffusion layer 11. Next, as shown in FIG. 10, a silicon oxide film 36 is embedded into the hole lying inside the polysilicon film 35.

Figure 11:
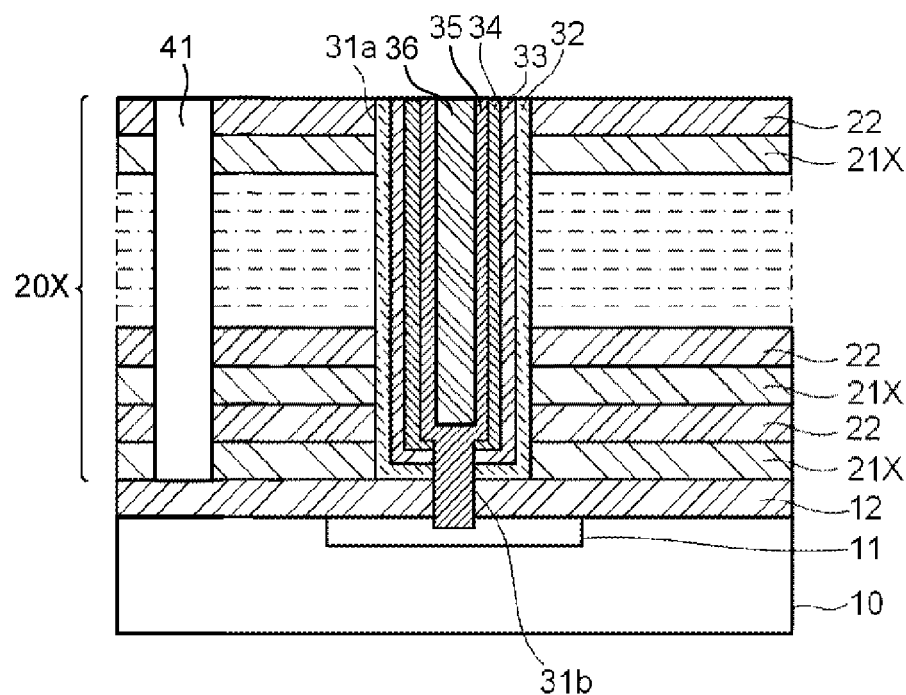
FIG. 11 is a cross-sectional view illustrating a semiconductor device manufacturing step according to the second embodiment.
Figure 12:
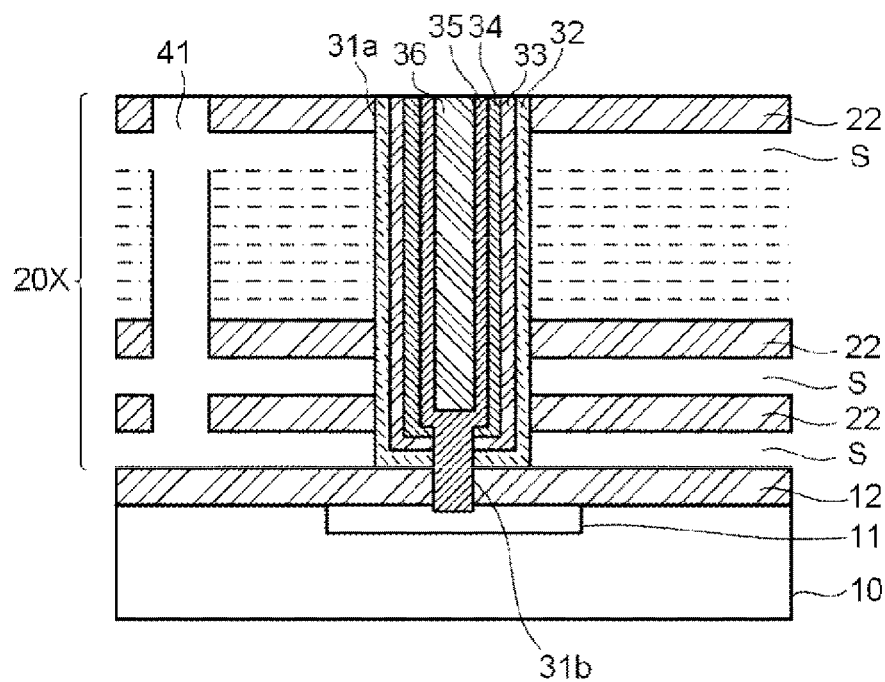
FIG. 12 is a cross-sectional view illustrating a semiconductor device manufacturing step according to the second embodiment.
Figure 13:
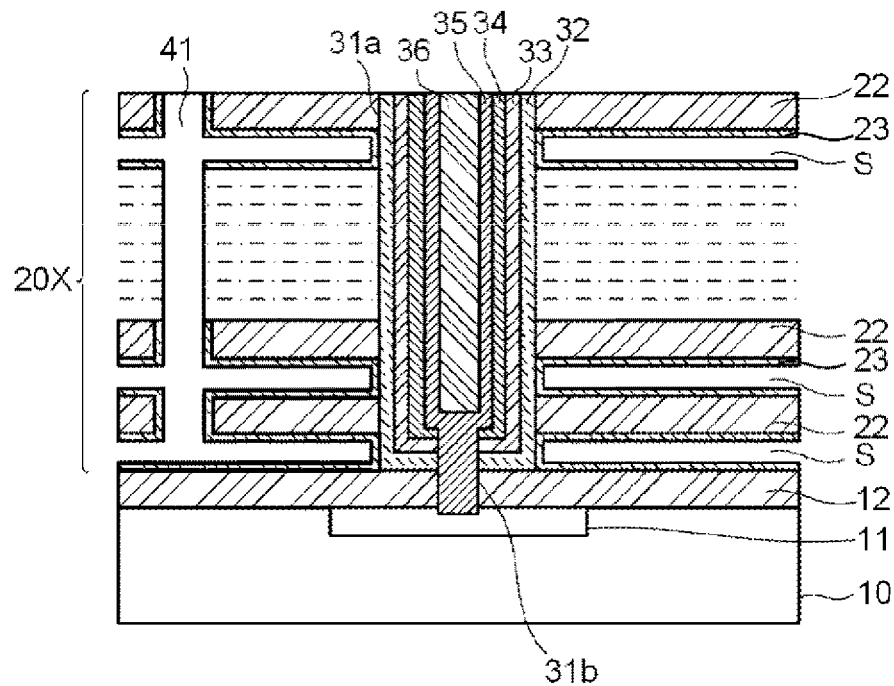
FIG. 13 is a cross-sectional view illustrating a semiconductor device manufacturing step according to the second embodiment.
Figure 14:
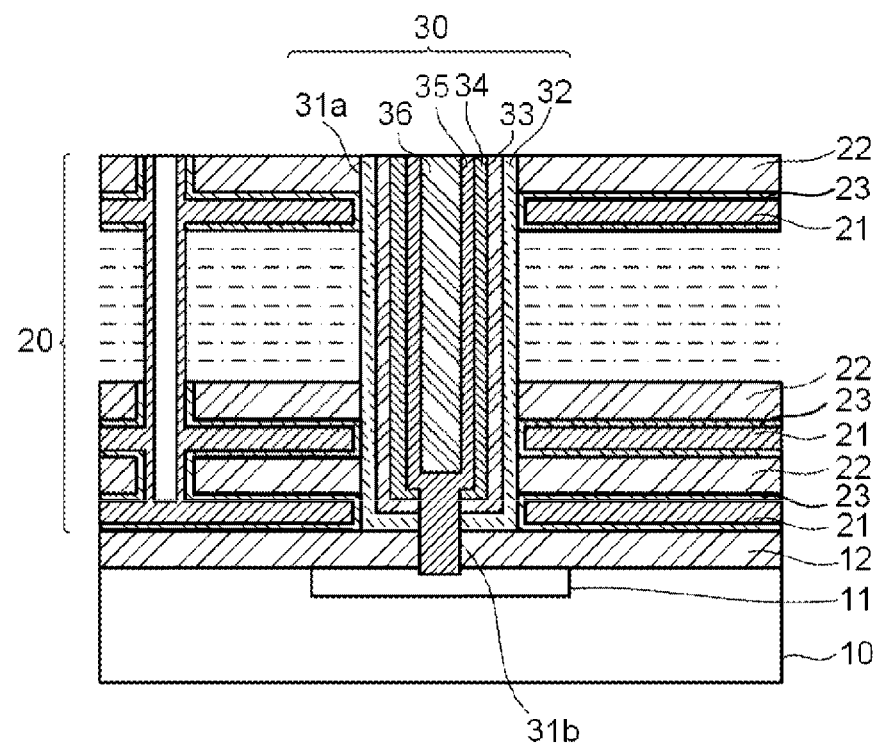
FIG. 14 is a cross-sectional view illustrating a semiconductor device manufacturing step according to the second embodiment.

Next, as shown in FIG. 11, a slit 41 is formed in the stacked structure 20X using lithography and RIE. As shown in FIG. 12, the silicon nitride films 21X are etched away with phosphoric acid heated to 150° C. supplied via the slit 41 to create spaces or recesses (to-be-filled spaces/recesses) S for the formation of conductive films 21. As shown in FIG. 13, aluminum oxide films as block insulating films 23, each having a thickness of about 5 nm, are formed on the wall surfaces surrounding the spaces S. The aluminum oxide films are formed by ALD using trimethylaluminum (TMA) and $O_3$. As shown in FIG. 14, a Mo film is filled into the spaces S surrounded by the block insulating films 23 to form conductive films 21, thereby forming a stacked structure 20. Thereafter, a Mo alloy in unnecessary portions is removed, and a silicon oxide film is embedded, and then not-shown upper interconnects, etc. are formed to produce a semiconductor device (three-dimensional stacked non-volatile memory device). The formation of the Mo film will be described in detail below.

The above-described Mo film formation process according to the first embodiment is used for the formation of the Mo films as the conductive films 21. The steps of the Mo film formation process are performed in the same manner as in the first embodiment. Thus, the adsorbing material supply step S-1, the Mo material supply step S-2, the reducing agent supply step S-3, the initial Mo film thickness determination step S-4, the Mo material supply step S-5, the reducing agent supply step S-6, and the final Mo film thickness determination step S-7 are performed in the same manner as in the first embodiment. The following are specific examples (Examples 1 to 4) of a process for producing a Mo film in the semiconductor memory device.

Example 1

First, $H_2O$ is supplied into a reaction chamber at a concentration which is adjusted according to a film-forming pressure (step 1) and, after stopping the supply of $H_2O$, the reaction chamber is purged with Ar (step 2). Next, $MoO_2Cl_2$ as a Mo material is supplied (step 3). Subsequently, after stopping the supply of the Mo material, the reaction chamber is purged with Ar (step 4). Next, $H_2$ as a reducing agent is supplied (step 5). Subsequently, the supply of $H_2$ is stopped, and the reaction chamber is purged with Ar (step 6). The steps 1 to 6 are repeated 20 times to form a Mo film having a thickness of 1 nm.

Next, using the gas supply sequence except the $H_2O$ supply step and the following Ar purge step (steps 1 and 2), a Mo film is embedded into the spaces S surrounded by the aluminum oxide films 23. In particular, $MoO_2Cl_2$ as a Mo material is supplied (step 7). Subsequently, after stopping the supply of the Mo material, the reaction chamber is purged with Ar (step 8). Next, $H_2$ as a reducing agent is supplied (step 9). Subsequently, the supply of $H_2$ is stopped, and the reaction chamber is purged with Ar (step 10). The steps 7 to 10 are repeated 300 times to form a Mo film having a thickness of about 15 nm. The $MoO_2Cl_2$ supply time in step 7 is preferably longer than the $MoO_2Cl_2$ supply time in step 3, and the $H_2$ supply time in step 9 is preferably shorter than the $H_2$ supply time in step 5.

Example 2

An example in which $NO_2$ is used as an adsorbing material instead of $H_2O$ will be described. First, $NO_2$ is supplied into a reaction chamber for 1 second in an amount which is adjusted according to a film-forming pressure (step 1) and, after stopping the supply of $NO_2$, the reaction chamber is purged with Ar (step 2). Next, $MoO_2Cl_2$ as a Mo material is supplied (step 3). Subsequently, after stopping the supply of the Mo material, the reaction chamber is purged with Ar (step 4). Next, $H_2$ as a reducing agent is supplied (step 5). Subsequently, the supply of $H_2$ is stopped, and the reaction chamber is purged with Ar (step 6). The steps 1 to 6 are repeated 20 times to form a Mo film having a thickness of 1 nm.

Next, using the gas supply sequence except the $NO_2$ supply step and the following Ar purge step (steps 1 and 2), a Mo film is embedded into the spaces S surrounded by the aluminum oxide films 23. In particular, $MoO_2Cl_2$ is supplied (step 7). Subsequently, after stopping the supply of the Mo material, the reaction chamber is purged with Ar (step 8). Next, $H_2$ is supplied (step 9). Subsequently, the supply of $H_2$ is stopped, and the reaction chamber is purged with Ar (step 10). The steps 7 to 10 are repeated 300 times to form a Mo film having a thickness of about 15 nm. The $MoO_2Cl_2$ supply time in step 7 is preferably longer than the $MoO_2Cl_2$ supply time in step 3, and the $H_2$ supply time in step 9 is preferably shorter than the $H_2$ supply time in step 5.

Example 3

An example in which HF is used as an adsorbing material instead of $H_2O$ will be described. First, the temperature of the substrate is set to 200° C., and HF is supplied into a reaction chamber in an amount which is adjusted according to a film-forming pressure (step 1) and, after stopping the supply of HF, the reaction chamber is purged with Ar (step 2). Next, $MoO_2Cl_2$ as a Mo material is supplied (step 3). Subsequently, after stopping the supply of the Mo material, the reaction chamber is purged with Ar (step 4). After repeating the steps 1 to 4 20 times, the temperature of the substrate is set to 500° C., and $H_2$ as a reducing agent is supplied (step 5) to form a Mo film having a thickness of 1 nm.

Next, using the gas supply sequence except the HF supply step and the following Ar purge step (steps 1 and 2), a Mo film is embedded into the spaces S surrounded by the aluminum oxide films 23. In particular, the temperature of the substrate is set to 500° C., and $MoO_2Cl_2$ is supplied (step 6). Subsequently, after stopping the supply of the Mo material, the reaction chamber is purged with Ar (step 7). Next, $H_2$ is supplied (step 8). Subsequently, after stopping the supply of $H_{er}$ the reaction chamber is purged with Ar (step 9). The steps 6 to 9 are repeated 300 times to form a Mo film having a thickness of about 15 nm. The $MoO_2Cl_2$ supply time in step 6 is preferably longer than the $MoO_2Cl_2$ supply time in step 3, and the $H_2$ supply time in step 8 is preferably shorter than the $H_2$ supply time in step 5.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, comprising the steps of:
   (a) adsorbing an adsorbing material over an insulating film, wherein the adsorbing material is selected from the group consisting of $H_2O$, HF, NO, $NO_2$, $NF_3$, and combinations thereof;
   (b) supplying a Mo material over the insulating film; and
   (c) supplying a reducing agent over the insulating film, wherein the insulating film is formed above a substrate, wherein the insulating film comprises a metal oxide.

2. The method for manufacturing a semiconductor device according to claim 1, further comprising the steps of:
   (d) repeating the steps (a) to (c); and
   after the step (d), repeating the steps (b) and (c).

3. The method for manufacturing a semiconductor device according to claim 1, wherein the insulating film comprises at least one of: a metal oxide, a metal nitride, or a metal oxynitride.

4. The method for manufacturing a semiconductor device according to claim 1, wherein the insulating film comprises aluminum oxide.

5. The method for manufacturing a semiconductor device according to claim 1, wherein the supplying the reducing agent reduces an amount of molybdenum oxide, formed based on the adsorbing material and the Mo material.

6. The method of claim 1, wherein step (b) is performed after step (a), and step (c) is performed after step (b).

7. The method for manufacturing a semiconductor device according to claim 1, further comprising the steps of:
   (d) after step (c), supplying a second adsorbing material over the insulating film, wherein the second adsorbing material is selected from the group consisting of $H_2O$, HF, NO, $NO_2$, $NF_3$, and combinations thereof;
   (e) after step (d), supplying a second Mo material over the insulating film; and
   (f) after step (e), supplying a second reducing agent over the insulating film.

8. The method for manufacturing a semiconductor device according to claim 1, wherein supplying the Mo material is performed before supplying any reducing agent over the insulating film.

9. The method for manufacturing a semiconductor device according to claim 1, wherein the Mo material is supplied over the insulating film over which the adsorbing material has been adsorbed.

10. The method for manufacturing a semiconductor device according to claim 1, wherein the adsorbing material is adsorbed over the insulating film before supplying any Mo material over the insulating film.

11. A method for manufacturing a semiconductor device, comprising the steps of:
    forming a stacked structure including first insulating films and second insulating films alternately disposed on top of one another;
    forming an opening through the stacked structure;
    forming a semiconductor film and a charge storage layer in the opening;
    removing the first insulating films to form cavities in the stacked structure; and
    forming third insulating films and molybdenum films in the cavities, respectively,
    wherein the step of forming molybdenum films comprises the steps of:
      adsorbing, over the third insulating film, at least one adsorbing material, selected from the group consisting of $H_2O$, HF, NO, $NO_2$ and $NF_3$, after the formation of the third insulating films;
      supplying a Mo material after the adsorption of the adsorbing material; and
      supplying a reducing agent, and
    wherein the step of adsorbing an adsorbing material, the step of supplying a Mo material, and the step of supplying a reducing agent are performed repeatedly,
    wherein the third insulating film comprises a metal oxide.

12. The method for manufacturing a semiconductor device according to claim 11, further comprising the step of:
    after performing the step of adsorbing an adsorbing material, the step of supplying a Mo material, and the step of supplying a reducing agent at least once, repeating the step of supplying a Mo material and the step of supplying a reducing agent.

13. The method for manufacturing a semiconductor device according to claim 11, further comprising the step of:
    forming a molybdenum film over the third insulating film.

14. The method for manufacturing a semiconductor device according to claim 13, wherein the molybdenum film is coupled to a semiconductor channel film via the third insulating film and a charge storage film.

15. The method for manufacturing a semiconductor device according to claim 11, wherein at least one of the third insulating films comprise at least one of: a metal oxide, a metal nitride, or a metal oxynitride.

16. The method for manufacturing a semiconductor device according to claim 11, wherein at least one of the third insulating films comprises aluminum oxide.

17. The method for manufacturing a semiconductor device according to claim 11, wherein at least one of the molybdenum films functions as a word line (WL).

18. The method of manufacturing a semiconductor device according to claim 11, wherein the supplying the Mo material is performed after the adsorbing the adsorbing material, and wherein the supplying the reducing agent is performed after the supplying the Mo material.

19. The method for manufacturing a semiconductor device according to claim 11, wherein the at least one adsorbing material is adsorbed over the third insulating film before supplying any Mo material over the third insulating film.

20. The method for manufacturing a semiconductor device according to claim 11, wherein the Mo material is supplied over the third insulating film over which the at least one adsorbing material has been adsorbed.

* * * * *